United States Patent [19]

Beesely

[11] Patent Number: 5,400,047
[45] Date of Patent: Mar. 21, 1995

[54] HIGH BRIGHTNESS THIN FILM ELECTROLUMINESCENT DISPLAY WITH LOW OHM ELECTRODES

[76] Inventor: Dwayne E. Beesely, 190 Main St., Apt. #2, New Canaan, Conn. 06840

[21] Appl. No.: 149,884

[22] Filed: Nov. 10, 1993

[51] Int. Cl.$^6$ .............................................. H01J 1/54
[52] U.S. Cl. .................................. 313/503; 313/498; 313/505
[58] Field of Search ............... 313/498, 503, 505, 506, 313/509; 345/76

[56] References Cited

U.S. PATENT DOCUMENTS

| | | | |
|---|---|---|---|
| 1,912,560 | 6/1930 | Wiles | 313/355 |
| 3,741,629 | 6/1973 | Kahn | 359/84 |
| 3,902,790 | 9/1975 | Hsieh et al. | 359/89 |
| 4,258,364 | 3/1981 | Kaufmann et al. | 345/38 |
| 4,533,217 | 8/1985 | Samek | 359/254 |
| 4,614,668 | 9/1986 | Topp et al. | 313/509 |
| 4,722,594 | 2/1988 | Crossland et al. | 359/98 |
| 4,744,640 | 5/1988 | Phillips | 359/254 |
| 4,753,517 | 6/1988 | Samek | 359/254 |
| 4,804,251 | 2/1989 | Jacobs | 359/254 |
| 4,963,788 | 10/1990 | King et al. | 313/503 |
| 5,163,220 | 11/1992 | Zeto et al. | 29/846 |

FOREIGN PATENT DOCUMENTS 0273320  7/1988  European Pat. Off. ............ 313/498

Primary Examiner—Alvin E. Oberley
Assistant Examiner—Walter Malinowski

[57] ABSTRACT

An electroluminescent (EL) display includes segmented low resistance transparent electrodes comprising a transparent material at each pixel site and a conductive assist structure between each pixel site in electrical contact with the adjacent transparent segments to form the segment low resistance transparent electrode. Each segmented electrode uses the higher resistance transparent material only at pixel sites, and the conductive low resistance assist structure between pixel sites to connect the transparent segments and provide a continuous electrode structure. The segmented electrode structure of the present invention provides an EL display which can be driven faster due to the decreased electrode resistance.

19 Claims, 9 Drawing Sheets

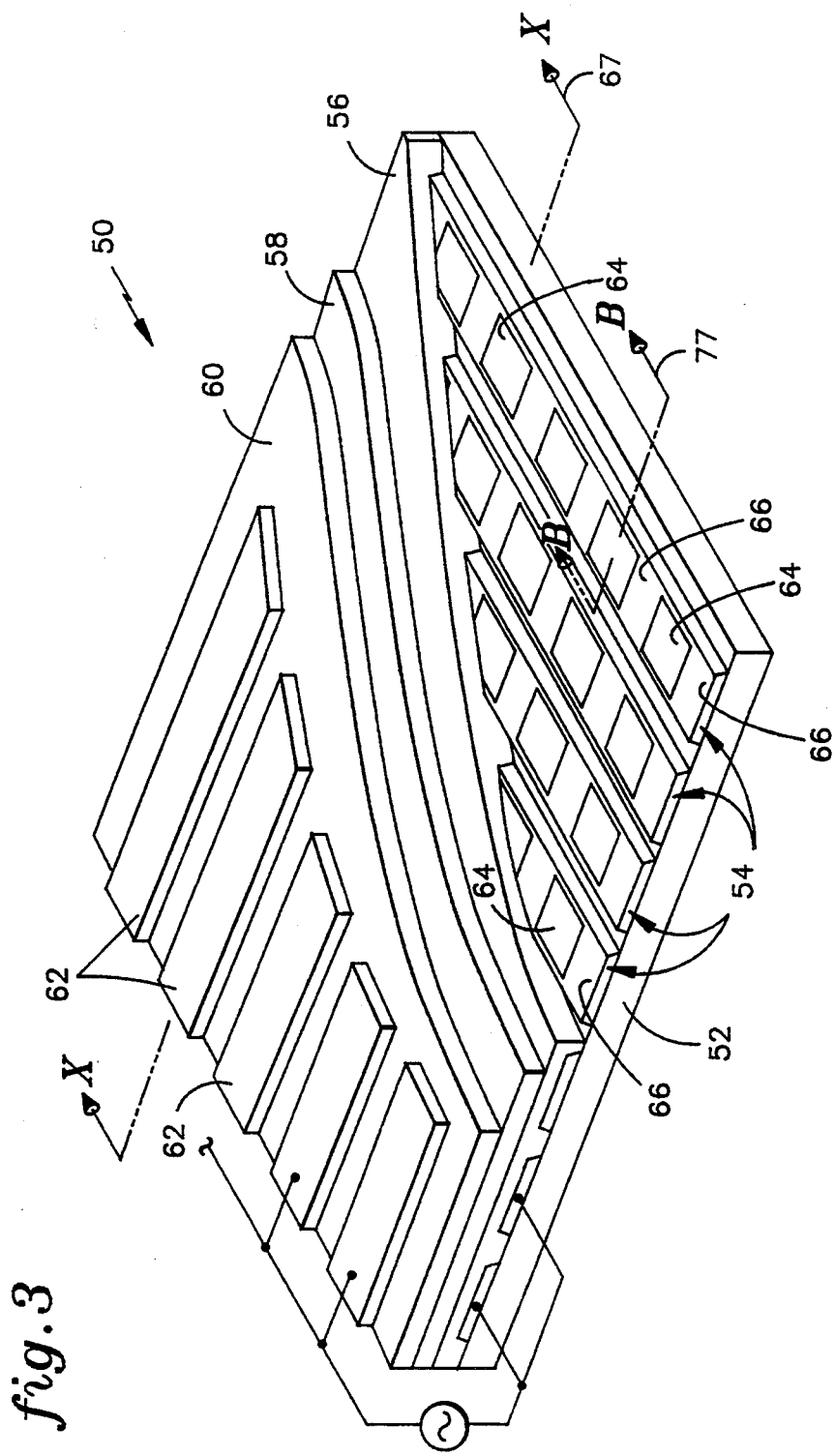

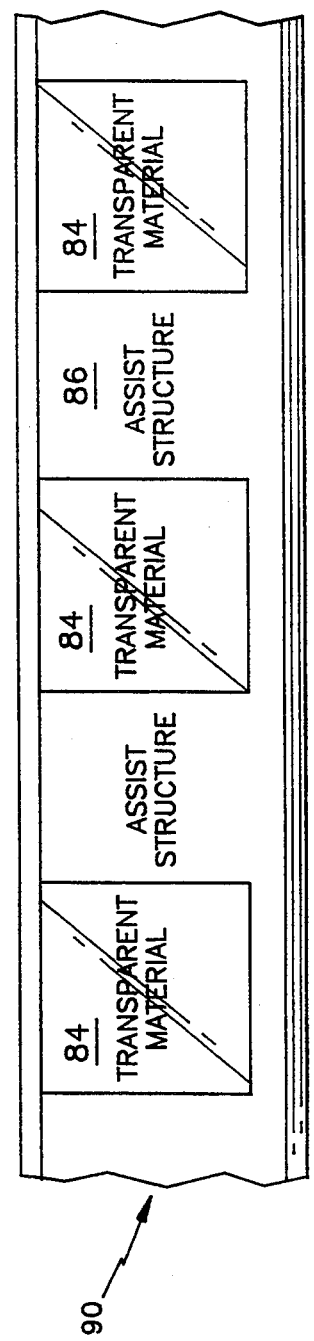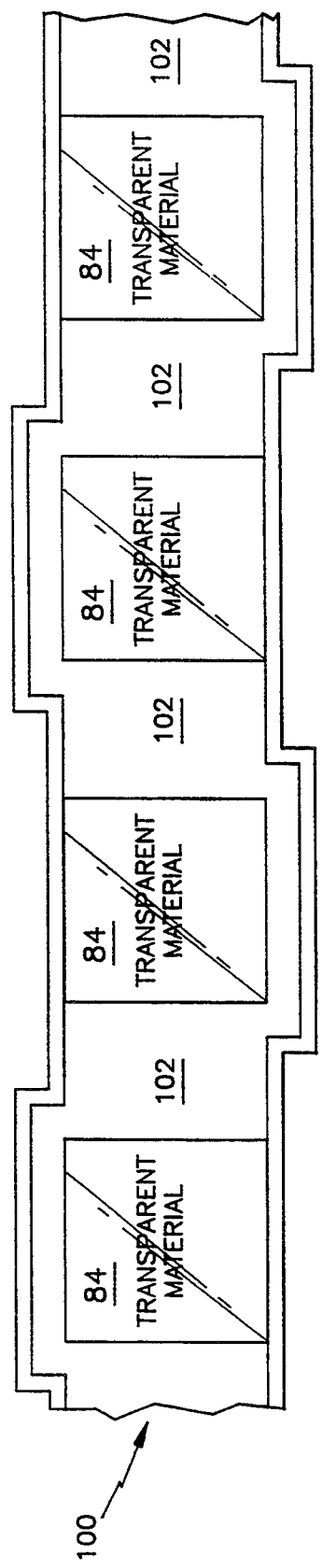

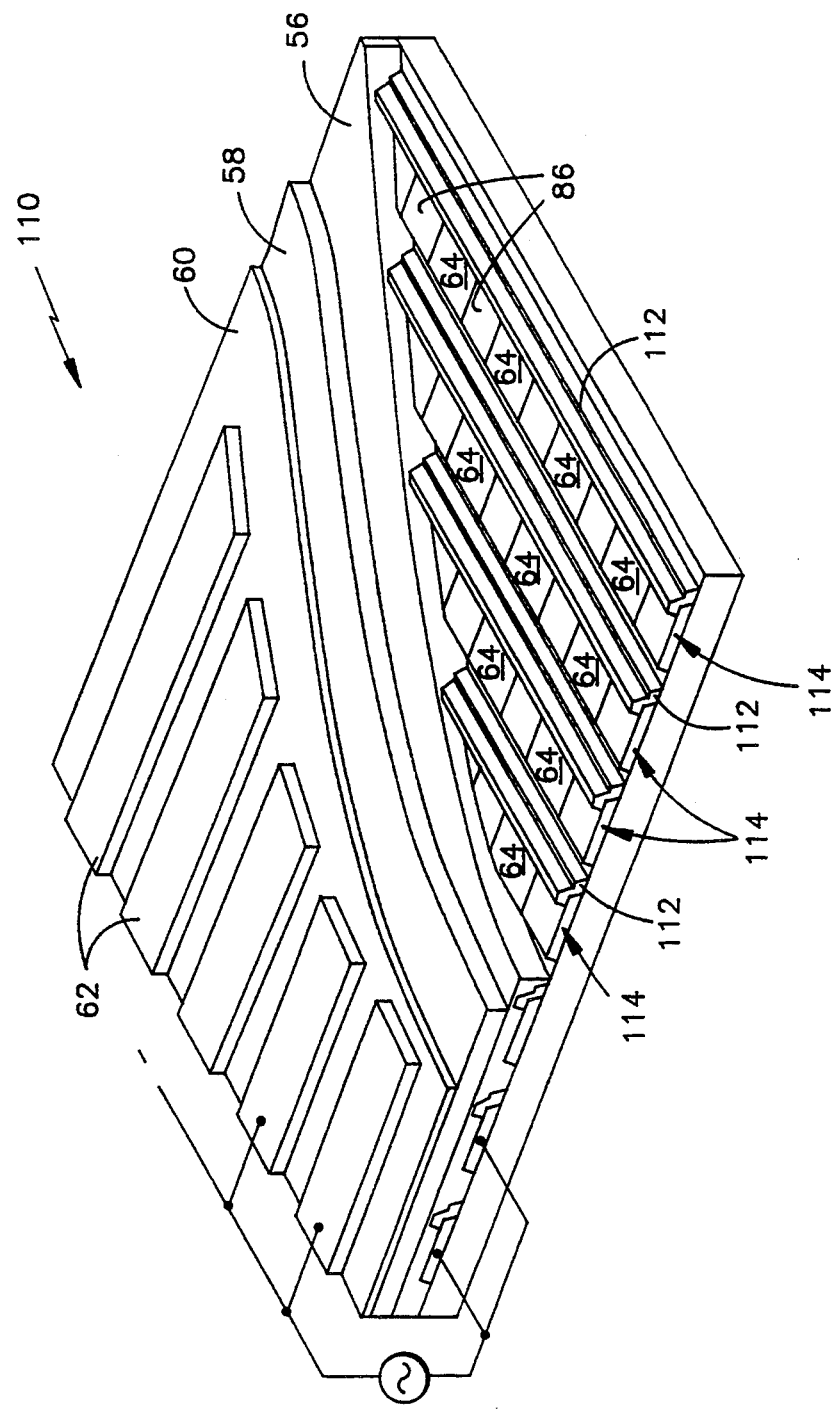

HIGH BRIGHTNESS THIN FILM ELECTROLUMINESCENT DISPLAY WITH LOW OHM ELECTRODES

CROSS REFERENCE TO RELATED APPLICATIONS

This application contains subject matter related to the following commonly assigned co-pending applications: Ser. No. 07/897,210 filed Jun. 11, 1992, now abandoned entitled "Low Resistance, Thermally Stable Electrode Structure for Electroluminescent Displays"; Ser. No. 07/990,991 filed Dec. 16, 1992 entitled "Sunlight Viewable Thin Film Electroluminescent Display"; Ser. No. 07/990,322 filed Dec. 14, 1992 entitled "Sunlight Viewable Thin Film Electroluminescent Display Having Darkened Metal Electrodes"; and Ser. No. 07/989,672 filed Dec. 14, 1992 entitled "Sunlight Viewable Thin Film Electroluminescent Display Having a Graded Layer of Light Absorbing Dark Material".

TECHNICAL FIELD

This invention relates to an electroluminescent (EL) display and more particularly to a high brightness EL display having low resistance transparent electrodes.

BACKGROUND ART

Thin film electroluminescent (TFEL) display panels offer several advantages over older display technologies such as cathode ray tubes (CRTs) and liquid crystal displays (LCDs). Compared with CRTs, TFELs display panels require less power, provide a larger viewing angle, and are much thinner. Compared with LCDs, TFEL display panels have a larger viewing angle, do not require auxiliary lighting, and can have a larger display area.

FIG. 1 shows a prior art TFEL display panel 10. The TFEL display has a glass panel 11, a plurality of transparent electrodes 12, a first layer of a dielectric 14, a phosphor layer 16, a second dielectric layer 18, and a plurality of metal electrodes 20 perpendicular to the transparent electrodes 12. The transparent electrodes 12 are typically indium-tin oxide (ITO) and the metal electrodes 20 are typically Al. The dielectric layers 14, 18 act as capacitors to protect the phosphor layer 16 from excessive currents. When an electrical potential, such as about 200 V, is applied between the transparent electrodes 12 and the metal electrodes 20 by a source 22, electrons tunnel from one of the interfaces between the dielectric layers 14, 18 and the phosphor layer 16 into the phosphor layer where they are rapidly accelerated. The phosphor layer 16 typically comprises ZnS doped with Mn. Electrons entering the phosphor layer 16 excites the Mn causing the Mn to emit photons. The photons pass through the first dielectric layer 14, the transparent electrodes 12, and the glass panel 10 to form a visible image. FIG. 2 illustrates a cross selectional view of the prior art TFEL display cut along the line AA 24 of FIG. 1.

Although current TFEL displays are satisfactory for some applications, more advanced applications require brighter higher contrast displays, larger displays, and sunlight viewable displays. One approach for increasing the brightness of the display is to use low resistance transparent electrodes which allows the display to be driven faster and hence increases the displays brightness. A problem with this approach is that while metal bus bar overlaps the transparent electrode to decrease electrode resistance, the overlapping structure interferes with light emitted from each pixel since pixel area is reduced, thus reducing the obtainable brightness of the display. If the electrode resistance can be reduced, the display can be driven faster resulting in brighter display.

DISCLOSURE OF THE INVENTION

An object of the present invention is to provide a brighter electroluminescent display.

Another object of the present invention is to provide a large electroluminescent display.

Yet another object of the present invention is to reduce the electrical resistance of the display's transparent electrodes.

According to the present invention, an electroluminescent display includes segmented low resistance transparent electrodes comprising a transparent material at each pixel site and a conductive low resistance assist structure between each pixel site in electrical contact with the adjacent transparent material segments to form the segmented low resistance transparent electrode.

An advantage of the present invention is the faster rate at which the display can be driven due to the decreased resistance of the segmented transparent electrodes. Each segmented electrode uses the higher resistance transparent material (e.g., ITO) only at pixel sites, and the conductive low resistance assist structure between pixel sites to connect the transparent segments and provide a continuous electrode structure.

In preferred display embodiments, the conductive low resistance assist structure forms a continuous assist structure length-wise along each segmented electrode. The conductive assist structure is deposited adjacent to and in electrical contact with each transparent segment without overlapping the pixel area of the transparent segments.

The present invention provides a brighter TFEL display since the electrode resistance is reduced without reducing the size of the pixel area. Reduced electrode resistance allows the display to be driven faster producing a brighter display since display brightness is directly proportional to the speed at which the display is driven.

These and other objects, features and advantages of the present invention will become more apparent in light of the following detailed description of a preferred embodiment thereof, as illustrated in the accompanying drawings.

BRIEF DESCRIPTION OF THE DRAWINGS

FIG. 3 illustrates a partial cut-a-way view of an improved TFEL display having segmented low resistance transparent electrodes;

FIG. 9 illustrates a top view of a segmented low resistance transparent electrode of FIG. 6;

FIG. 10 illustrates a top view of another segmented low resistance electrode embodiment;

FIG. 11 illustrates a partially cut-a-way view of an alternative embodiment TFEL display having yet another alternative embodiment of segmented low resistance transparent electrodes including an assist structure which overlaps slightly into the pixel area.

BEST MODE FOR CARRYING OUT THE INVENTION

Figure 1:
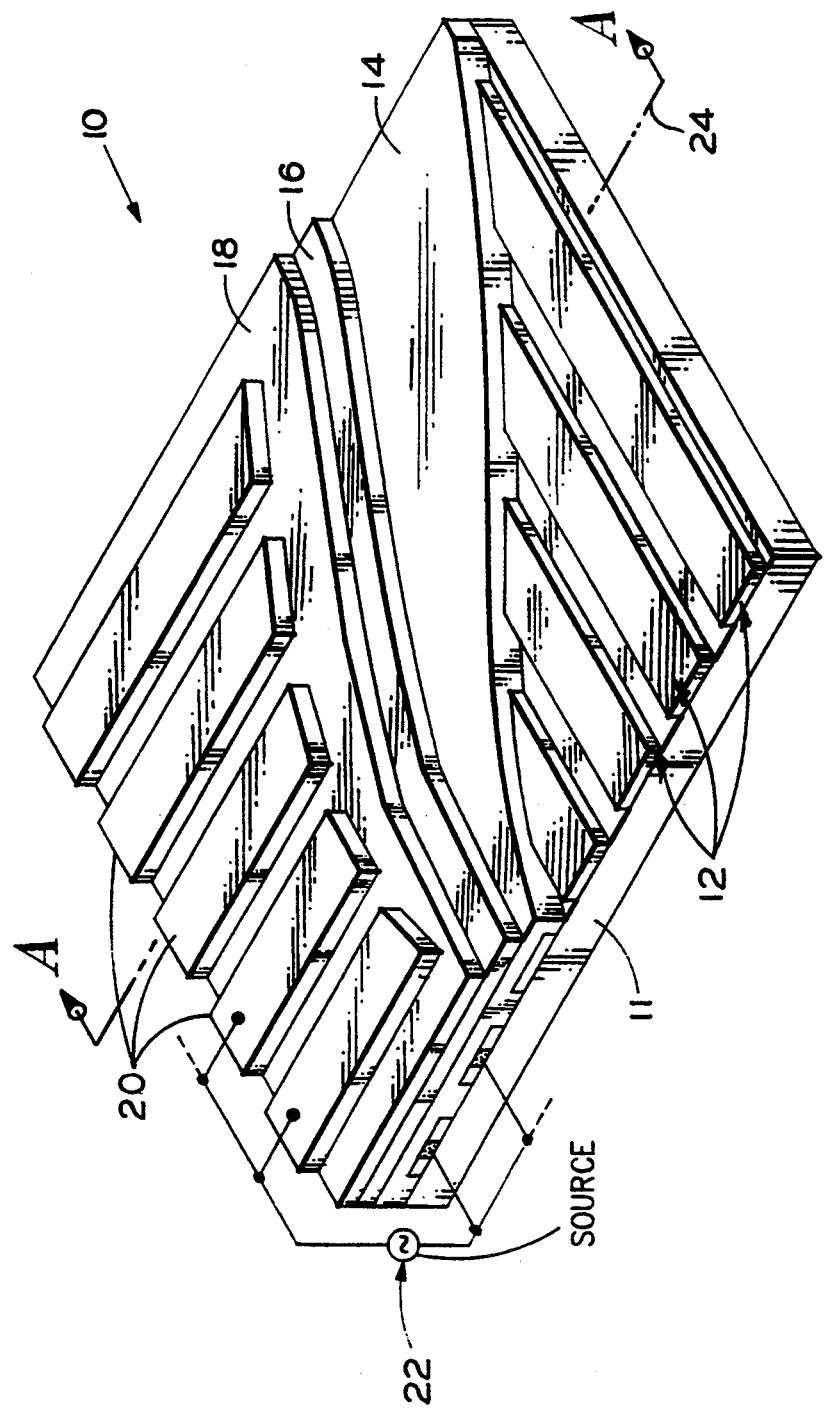
FIG. 1 illustrates a partial cut-a-way view of a prior art TFEL display.
Figure 2:
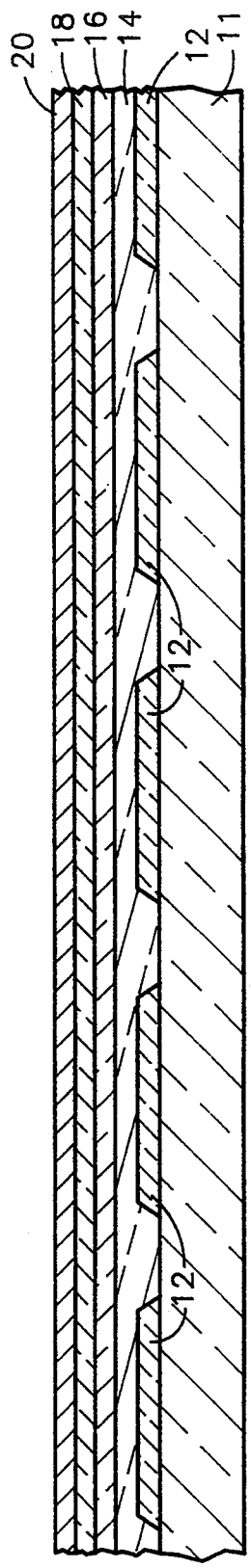
FIG. 2 illustrates a cross-sectional view of the prior art TFEL display of FIG. 1.
Figure 4:
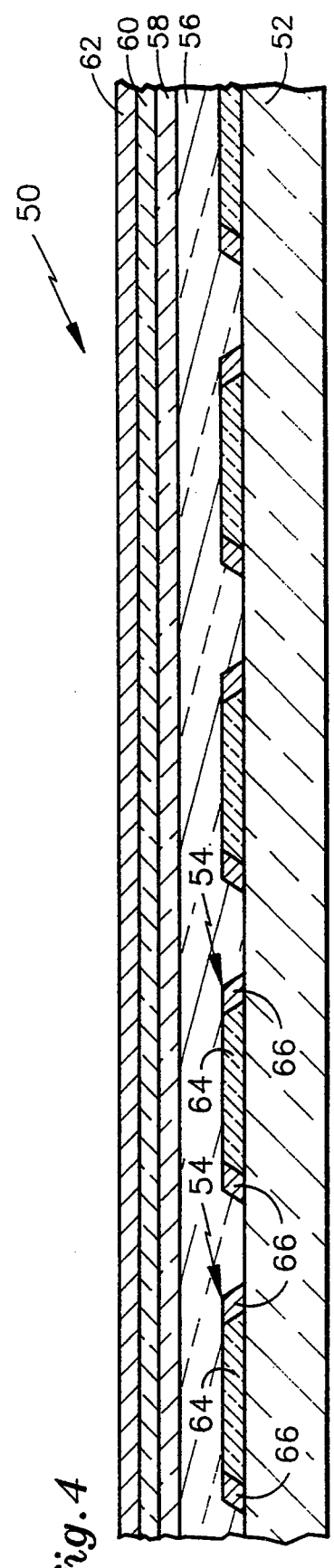
FIG. 4 illustrates a cross-sectional view of the improved TFEL display of FIG. 3 cut along the line XX.
Figure 5:
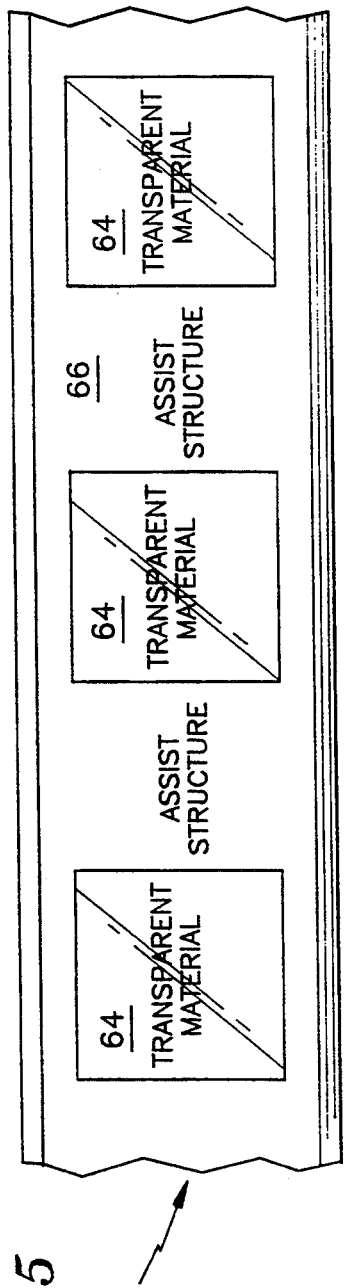
FIG. 5 illustrates a top view of a segmented low resistance transparent electrode of FIGS. 3 and 4.
Figure 6:
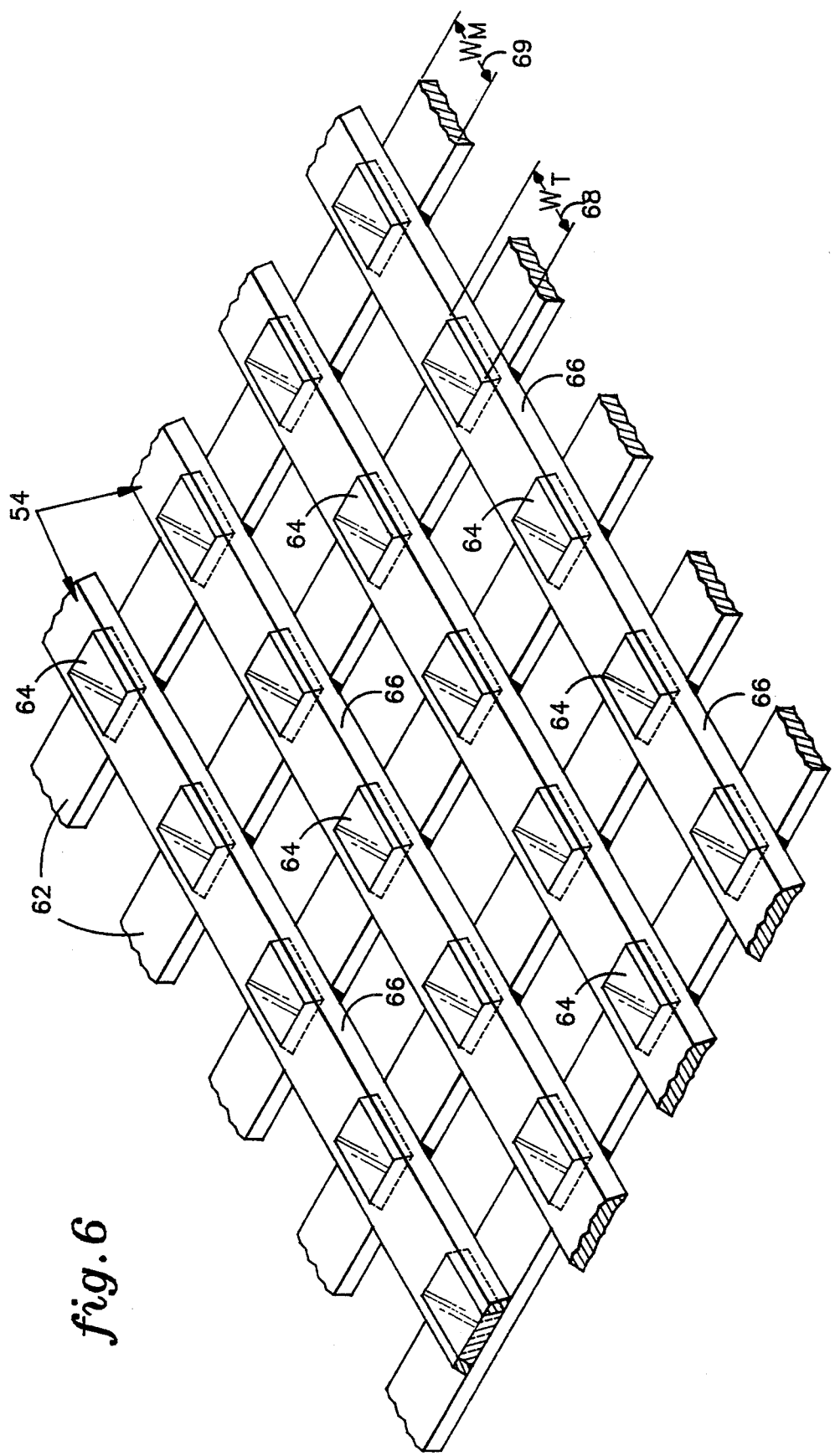
FIG. 6 illustrates just the intersecting segmented low resistance transparent electrodes and the metal electrodes.

Referring to FIG. 3, an improved thin film electroluminescent (TFEL) display 50 according to the present invention includes a glass panel 52, a plurality of segmented transparent electrodes 54, a first dielectric layer 56, a phosphor layer 58, a second dielectric layer 60, and a plurality of metal electrodes 62 perpendicular to the segmented transparent electrodes 54. Each segmented electrode 54 includes a plurality of transparent segments 64 positioned at each intersection of the metal electrodes 62 and the segmented electrodes 54. The intersection of the metal electrodes 62 and the segmented electrodes 54 forms a pixel area. The remainder of each segmented electrode structure 54 includes a highly conductive assist structure 66. An advantage of the segmented electrode 54 structure is its low overall electrode resistance due to the highly conductive nature of the assist structure 66, while ensuring each pixel area is not reduced (i.e., the assist structure 66 does not overlap into the pixel area reducing the light output). FIG. 4 illustrates a cross-sectional view of the improved TFEL display of FIG. 3 cut along the line XX 67 (FIG. 3). Notice the assist structure 66 runs along both sides and in electrical contact with the transparent material segment 64. The edges of both the segmented transparent material 64 and the assist structure 66 should be chamfered to promote adhesion and electrical contact. FIG. 5 illustrates a top view of a single segmented low resistance transparent electrode 54 of FIG. 3 illustrating three pixel areas. Note, the assist structure 66 runs adjacent to and between the transparent material segments but does not overlap the transparent material. In the interest of clarity several layers 52, 56, 58 and 60 have been removed, and FIG. 6 illustrates just the orthogonally intersecting segmented low resistance transparent electrodes 54 and the metal electrodes 62 which form pixel areas at each intersection. The width $W_T$ 68 of each transparent segment 64 should be about equal to the width $W_M$ 69 of the metal electrode 62 to increase the light output from each pixel area.

Figure 7:
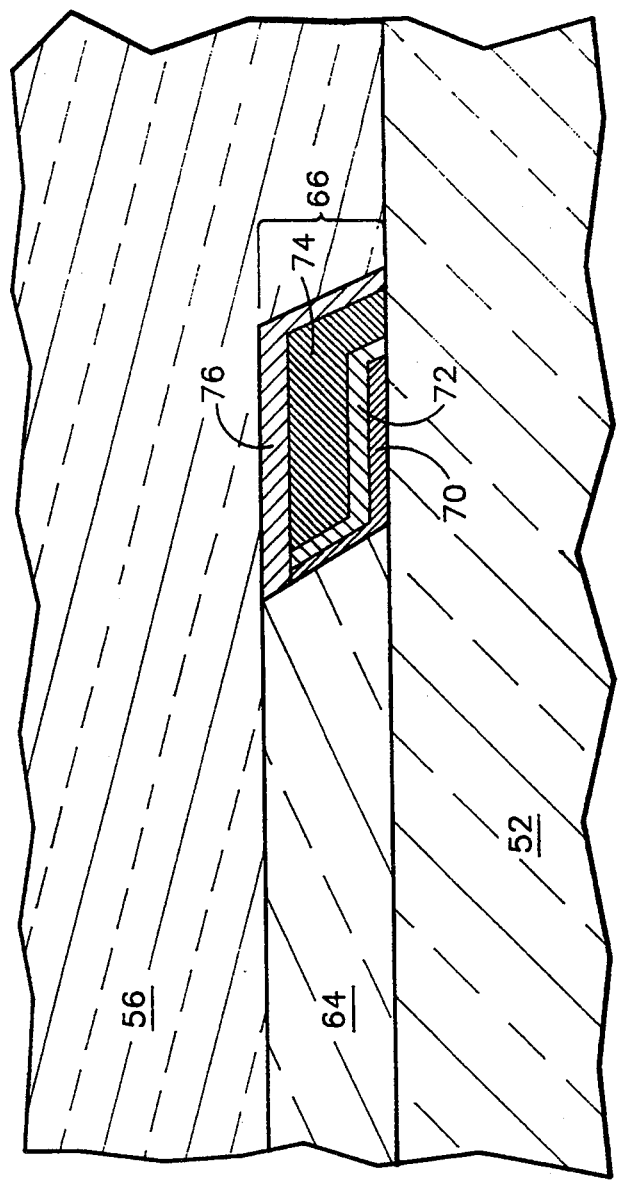
FIG. 7 illustrates an enlarged cross-sectional view of a single transparent electrode and an associated metal assist structure cut along the line BB of FIG. 3.

Preferably each assist structure 66 includes one or more layers of an electrically conductive metal compatible with the segmented transparent material 64 and other structures in the TFEL display panel 50. Referring to FIG. 7, a preferred embodiment of the assist structure 66 is a sandwich of an adhesion layer 70, a first refractory metal layer 72, a primary conductor layer 74, and a second refractory metal layer 76. FIG. 7 illustrates a cross-sectional view of the segmented electrode structure cut along a line BB 77 in FIG. 3. The adhesion layer 70 promotes the bonding of the assist structure 66 to the glass panel 52 and the transparent material segment 64. The adhesion layer 76 can include any electrically conductive metal or alloy that can bond to the glass panel 52, transparent material 64, and first refractory metal layer 72 without forming stresses that may cause the adhesion layer 70 or any of the other layers to peel away from these structures. Suitable metals include Cr, V, and Ti. Cr is preferred because it evaporates easily and provides good adhesion. Preferably, the adhesion layer 70 will be only as thick as needed to form a stable bond between the structures it contacts. For example, the adhesion layer 70 can be about 10 nm to about 20 nm thick. If the first refractory metal layer 72 can form stable, low stress bonds with the layers it comes into contact with the adhesion layer 70 may not be needed. In that case, the assist structure 66 can have only three layers: the two refractory metal layers 72, 76 and the primary conductor layer 74.

The refractory metal layers 72, 76 protect the primary conductor layer 74 from oxidation and prevent the primary conductor layer from diffusing into the first dielectric layer 56 and phosphor layer 58 when the display is annealed to activate the phosphor layer as described below. Therefore, the refractory metal layers 72, 76 should include a metal or alloy that is stable at the annealing temperature, can prevent oxygen from penetrating the primary conductor layer 74, and can prevent the primary conductor layer 74 from diffusing into the first dielectric layer 56 or the phosphor layer 58. Suitable metals include W, Mo, Ta, Rh, and Os. Both refractory metal layers 72,76 can be up to about 50 nm thick. Because the resistivity of the refractory layers can be higher than the resistivity of the primary conductor 74, the refractory layers 72, 76 should be as thin as possible to allow for the thickest possible primary conductor layer 74. Preferably, the refractory metal layers 72, 76 will be about 20 nm to about 40 nm thick.

The primary conductor layer 74 conducts most of the current through the assist structure 66. The primary conductor layer 74 can be any highly conductive metal or alloy such as Al, Cu, Ag, or Au. Al is preferred because of its high conductivity, low cost, and compatibility with later processing. The primary conductor layer 74 should be as thick as possible to maximize the conductivity of the assist structure 66. Its thickness is limited by the total thickness of the assist structure 66 and the thicknesses of the other layers. For example, the primary conductor layer 74 can be up to about 200 nm thick. Preferably, the primary conductor layer 74 will be about 50 nm to about 180 nm thick.

The TFEL display 50 of the present invention can be made by any method that forms the desired structures. The segmented transparent electrodes 54, dielectric layers 56, 60, phosphor layer 58 and metal electrodes 62 can be made with conventional methods known to those skilled in the art. The assist structures 66 can be made with an etch-back method, a lift-off method, or any other suitable method for depositing the layers in the assist structure 66.

The first step in making the TFEL display 50 of FIG. 3 is to deposit a layer of a transparent conductor on a suitable glass panel 52. The glass panel can be any high temperature glass that can withstand the phosphor anneal step described below. For example, the glass panel can be a borosilicate glass such as Corning 7059 (Corning Glassworks, Corning, N.Y.). The transparent conductive material can be any suitable material that is electrically conductive and has a sufficient optical transmittance for a desired application. For example, the transparent material 64 can be ITO, a transition metal semiconductor that comprises about 10 mole percent In, is electrically conductive, and has an optical transmittance of about 95% at a thickness of about 300 nm. The transparent material 64 can be any suitable thickness that completely covers the glass and provides the desired conductivity. Glass panels on which a suitable ITO layer has already been deposited can be purchased from Donnelly Corporation (Holland, Mich.). The remainder of the procedure for making the TFEL display of the present invention will be described in the context of using ITO for the transparent segments 64. One skilled in the art will recognize that the procedure for a different transparent material would be similar.

Transparent ITO segments 64 can be formed in the ITO layer by a conventional etch-back method or any other suitable method. For example, parts of the ITO layer that will become the transparent segments 64 can be cleaned and covered with an etchant-resistant mask. The etchant-resistant mask can be made by applying a suitable photoresist chemical to the ITO layer, exposing the photoresist chemical to an appropriate wavelength of light, and developing the photoresist chemical. A photoresist chemical that contains 2-ethoxyethyl acetate, n-butyl acetate, xylene, and xylol as primary ingredients is compatible with the present invention. One such photoresist chemical is AZ 4210 Photoresist (Hoechst Celanese Corp., Somerville, N.J.). AZ Developer (Hoechst Celanese Corp., Somerville, N.J.) is a proprietary developer compatible with AZ 4210 Photoresist. Other commercially available photoresist chemicals and developers also may be compatible with the present invention. Unmasked parts of the ITO are removed with a suitable etchant to form the segments in the ITO layer that define the sides of the transparent segments 64. The etchant should be capable of removing unmasked ITO without damaging the masked ITO or glass under the unmasked ITO. A suitable ITO etchant can be made by mixing about 1000 ml $H_2O$, about 2000 ml HCl, and about 370 g anhydrous $FeCl_3$. This etchant is particularly effective when used at about 55° C. The time needed to remove the unmasked ITO depends on the thickness of the ITO layer. For example, a 300 nm thick layer of ITO can be removed in about 2 min. All four sides of the transparent segments 64 should be chamfered to ensure that the subsequently deposited assist structure 66 adequately covers the transparent ITO segments 64 and conductively contacts the ITO. The size and spacing of the transparent ITO segments 64 depends on the dimensions of the TFEL display. For example, a typical 12.7 cm (5 in) high by 17.8 cm (7 in) wide display can have transparent ITO segments 64 that are about 30 nm thick, about 250 $\mu$m (10 mils) wide, and spaced about 125 $\mu$m (5 mils) apart. After etching, the etchant-resistant mask is removed with a suitable stripper, such as one that contains tetramethylammonium hydroxide. AZ 400T Photoresist Stripper (Hoechst Celanese Corp.) is a commercially available product compatible with the AZ 4210 Photoresist. Other commercially available strippers also may be compatible with the present invention.

After forming transparent ITO segments 64, the layers for the assist structure 66 that will form the remainder of the segmented electrode 54 are deposited. The sides of the metal structure 66 should be chamfered to promote bonding with the first dielectric layer 56. The layers of the assist structure 66 are deposited with any conventional technique capable of making layers of uniform composition and resistance. Suitable methods include sputtering and thermal evaporation. Preferably, all the layers 70, 72, 74, 76 will be deposited in a single run to promote adhesion by preventing oxidation or surface contamination of the metal interfaces. An electron beam evaporation machine, such as a Model VES2550 (Airco Temescal, Berkeley, Calif.) or any comparable machine, that allows for three or more metal sources can be used. The metal layers should be deposited to the desired thickness over the entire surface of the panel in the order in which they are adjacent to the transparent ITO segments 64. The transparent segments and the assist structure ideally form a planar surface onto which the subsequent layers are deposited.

Once the assist structure layers 70, 72, 74 and 76 are deposited on the panel, the assist structures 66 can be formed with any suitable method, including etch-back. The portions of the layers 70, 72, 74 and 76 that will become the assist structures 66 can be covered with an etchant-resistant mask made from a commercially available photoresist chemical by conventional techniques. The same procedures and chemicals used to mask the transparent ITO segments 64 can also be used for the assist structures 66. Unmasked parts of layers 70, 72, 74 and 76 which form the assist structure 66 are removed with a series of etchants in the opposite order from which they were deposited. The etchants should be capable of removing a single, unmasked metal layer without damaging any other layer on the panel. A suitable W etchant can be made by mixing about 400 ml $H_2O$, about 5 ml of a 30 wt% $H_2O_2$ solution, about 3 g $KH_2PO_4$, and about 2 g KOH. This etchant, which is particularly effective at about 40° C., can remove about 40 nm of a W refractory metal layer in about 30 seconds. A suitable Al etchant can be made by mixing about 25 ml $H_2O$, about 160 ml $H_3PO_4$, about 10 ml $HNO_3$, and about 6 ml $CH_3COOH$. This etchant, which is effective at room temperature, can remove about 120 nm of an Al primary conductor layer in about 3 minutes. A commercially available Cr etchant that contains $HClO_4$ and $Ce(NH_4)_2(NO_3)_6$ can be used for the Cr layer. CR-7 Photomask (Cyantek Corp., Fremont, Calif.) is one Cr etchant compatible with the present invention. This etchant is particularly effective at about 40° C. Other commercially-available Cr etchants also may be compatible with the present invention.

Once the segmented electrodes 54 are formed, the dielectric layers 56, 60 and phosphor layer 58 can be deposited over the segmented electrodes 54 using any suitable conventional method, including sputtering or thermal evaporation. The two dielectric layers 56, 60 can be any suitable thickness, such as about 80 nm to about 250 nm thick, and can comprise any dielectric capable of acting as a capacitor to protect the phosphor layer 58 will comprise $SiO_xN_x$. The phosphor layer 58 can be any from excessive electrical currents. Preferably, the dielectric layers 56, 58 will be about 200 nm thick and conventional TFEL phosphor, such as ZnS doped with less than about 1% Mn, and can be any suitable thickness. Preferably, the phosphor layer 58 will be about 500 nm thick. After these layers are deposited, the display should be heated to about 500° C. for about 1 hour to anneal the phosphor. Annealing causes Mn atoms to migrate to Zn sites in the ZnS lattice from which they can emit photons when excited.

After annealing the phosphor layer 58, metal electrodes 62 are formed on the second dielectric layer 60 by any suitable method, including etch-back or liftoff. The metal electrodes 62 can be made from any highly conductive metal, such as Al. As with the segmented electrodes 54, the size and spacing of the metal electrodes 62 depend on the dimensions of the display. For example, a typical 12.7 cm (5 in) high by 17.8 cm (7 in) wide TFEL display can have metal electrodes 62 that are about 100 nm thick, about 250 μm (1.0 mils) wide, and spaced about 125 μm (5 mils) apart. The metal electrodes 62 should run orthogonal to the segmented electrodes 54.

Figure 8:
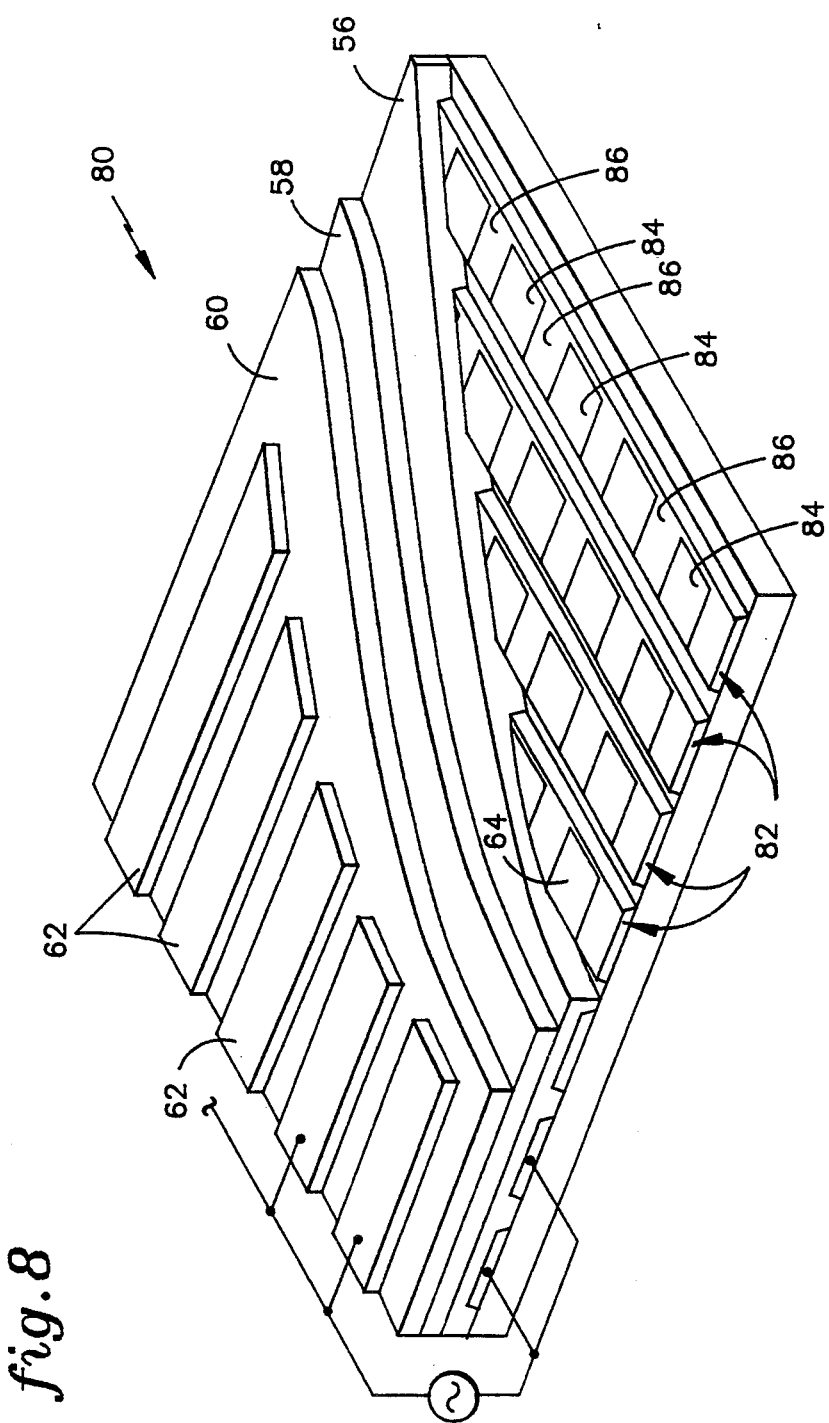
FIG. 8 illustrates a partial cut-a-way view of a TFEL display having an alternative embodiment of segmented low resistance transparent electrodes.

FIG. 8 illustrates an alternative embodiment EL display 80 having segmented transparent electrodes 82 of the present invention. Each segmented transparent electrode 82 includes a plurality of transparent segments 84 interconnected by an assist structure 86. In this embodiment the assist structure 86 only runs along three sides of the transparent segment 84 as opposed to all four sides in the embodiment of FIG. 3. The embodiments of FIG. 3 and FIG. 8 are substantially the same and differ only in the positioning of the transparent segments 84 within the assist structure 86. The transparent segments 84 are preferably ITO and the assist structure is either the three or four layer assist structure 66 discussed earlier with respect to FIG. 7. FIG. 9 illustrates a top view 90 of a single segmented low resistance transparent electrode 82 of FIG. 8 to more particularly illustrate the positioning of the transparent material 84 (e.g., preferably ITO) and the assist structure 86.

FIG. 10 illustrates a top view of yet another alternative embodiment 100 having a serpentine assist structure 102 between and adjacent to, and in electrical contact with the transparent segments 84. Similar to the embodiments of FIGS. 3 and 9, the serpentine assist structure 102 of FIG. 10 is preferably the three of four layer structure illustrated in FIG. 7 with chamfered edges.

While the embodiments presented thus far all include assist structures (e.g., 66, 86 and 102) which do not overlap into the pixel area, one skilled in the art will clearly appreciate the invention is not necessarily so limited and that in fact the assist structures may overlap the transparent segments 64, 84 if the light reduction due to the reduction in pixel area is acceptable for the particular display application. As an example, FIG. 11 illustrates an alternative embodiment EL display 110 having a bus bar 112 which runs length-wise along and overlapping onto the segmented electrode 114. The alternative embodiment display 110 is substantially like the display 50 of FIG. 3 with the exception that each segmented electrode 114 includes the bus bar 112 which slightly overlaps and runs continuously along the entire length of segmented electrode 114. Nevertheless, both embodiments (FIGS. 3 and 11) use transparent material 84 and an assist structure 86 to form a segmented electrode 54, 114 which provides a low resistance electrode having transparent pixels. Although the segmented electrodes 114 of FIG. 11 may have lower resistance than the segmented electrodes of FIGS. 3, 8, and 10 which allows the display to driven faster, the resultant increase in brightness due to the faster drive must be weighed against decrease in light output due to the decrease in the pixel area as a result of the overlapping bus bar 112.

To decrease the amount of pixel area covered by each bus bar 112, the bus bar should only overlap (i.e., cover) a small portion of the transparent material. For example, the bus bar 112 can cover about 10% or less of the segmented electrode 114 width. Therefore, for a typical segmented electrode 114 that is about 250 μm (10 mils) wide, the bus bar 112 should overlap the electrode 114 by about 25 μm (1 mill) or less. Overlaps as small as about 6 μm (0.25 mils) to about 13 μm (0.5 mils) are desirable. Although the bus bar 112 should overlap the transparent electrode 114 as little as possible, the bus bar should be as wide as practical to further decrease the electrical resistance of the segmented electrode 114. For example, a bus bar 112 that is about 50 μm (2 mils) to about 75 μm (3 mils) wide may be desirable. These two design parameters can be satisfied by allowing the bus bar to overlap the glass panel 52 as well as the electrode 114. With current fabrication methods, the thickness of the bus bar 112 should be equal to or less than the thickness of the first dielectric layer 56 to ensure that the first dielectric layer 56 adequately covers the electrode 114.

Figure 12:
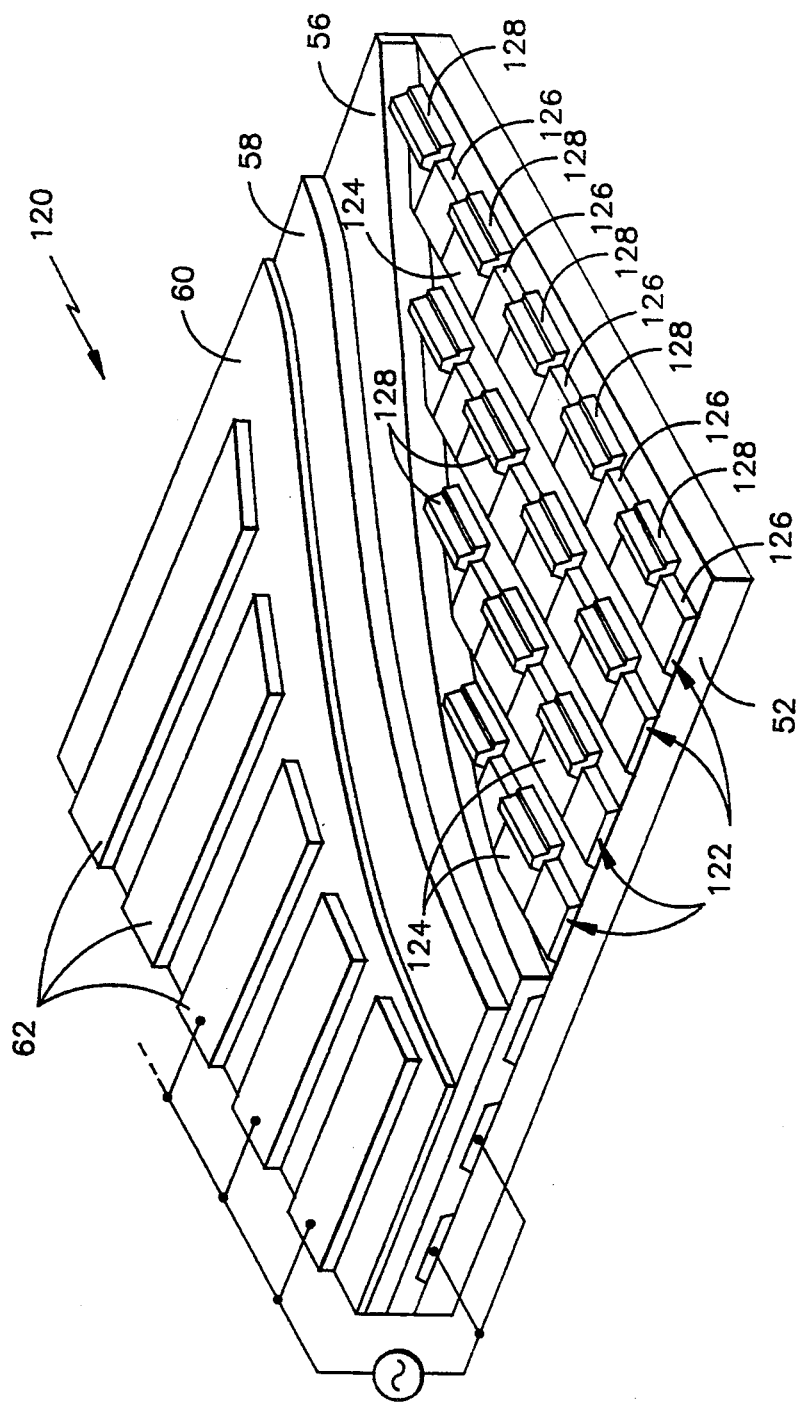
FIG. 12 illustrates a partially cut-a-way view of a TFEL display having an additional alternative embodiment of the segmented low resistance transparent electrodes.

FIG. 12 illustrates yet another alternative embodiment EL display 120 having segmented transparent electrodes 122 according to the present invention. Each segmented electrode 122 includes transparent material 124 (e.g., ITO) located at pixel sites interconnected by assist structure segments 126. The transparent material segments 124 are similar in composition to the transparent material 64 of FIG. 3 and includes chamfered surfaces on all sides to promote adhesion and intimate electrical contact with the assist structure 126. The assist structure 126 may include a single metal structure or a multi-layered structure similar to the assist structure 68 of FIG. 7. The edges of the assist structure 126 should also be chamfered to promote adhesion with the first dielectric layer 56. As described so far the embodiment of FIG. 12 is similar to the embodiment of FIG. 11. The two differ primarily in that the embodiment of FIG. 12 uses a discontinuous bus bar structure 128 while the embodiment of FIG. 11 uses a continuous bus bar structure 112 which runs lengthwise along the segmented electrode 114 (FIG. 11).

The present invention provides several benefits over the prior art. For example, the combination of using the transparent material segments (e.g., ITO) only at pixel sites wherein each pixel site is connected along the segmented electrode by a highly conductive assist structure provides a low resistance electrode which allows the display to be driven at a faster rate. Since display brightness is directly proportional to drive speed, the present invention provides a brighter display panel. This makes large TFEL displays such as a 60 inch display feasible since the segmented electrode can carry enough current to all the pixels sites within the electrode to provide an evenly distributed brightness across the entire panel.

The present invention is not limited to monochrome displays, color displays (e.g., RGB, RGY, etc.) can also use the segmented electrodes of the present invention. In addition, the present invention is clearly not limited to the multi-layer assist structure embodiments presented herein, the assist structure may be a single electrically conductive metallic material capable of adhering to adjacent display panel layers, or even a two layer structure which is compatible with the other materials of the display.

The foregoing changes and variations are merely a few examples (i.e., embodiments) which illustrate the underlying principle covered by the present invention. That is, according to the present invention, an electroluminescent display includes segmented low resistance transparent electrodes comprising a transparent material at each pixel site and a conductive low resistance assist structure between each pixel site in electrical contact with the adjacent transparent material segments to form the segmented low resistance transparent electrode.

An advantage of the present invention is the faster rate at which the display can be driven due to the decreased resistance of the segmented transparent electrodes. Each segmented electrode uses the higher resistance transparent material (e.g., ITO) only at pixel sites, and the conductive low resistance assist structure between pixel sites to connect the transparent segments and provide a continuous electrode structure.

Although the invention has been shown and described with respect to a preferred embodiments thereof, it should be understood by those skilled in the art that various other changes, omissions, and additions may be made to the embodiments disclosed herein, without departing from the spirit and scope of the present invention.

I claim:

1. An electroluminescent display panel, comprising:
    a glass substrate;
    a plurality of planar parallel segmented front transparent electrodes deposited on said glass substrate, each of said segmented front transparent electrodes having a plurality of transparent material segments electrically interconnected by an adjacent electrically conductive assist structure to form planar segmented front transparent electrodes;
    a first dielectric layer deposited on said plurality of transparent electrodes;
    a layer of phosphor deposited on said first dielectric layer;
    a second dielectric layer deposited on said layer of phosphorus material; and
    a plurality of parallel rear metal electrodes deposited over said second dielectric layer and orthogonal to said plurality of parallel planar segmented front transparent electrodes.

2. The electroluminescent display panel of claim 1, wherein each of said assist structures comprises a first refractory metal layer, a primary conductor layer formed on said first refractory layer, and a second refractory metal layer formed on said primary conductor layer such that said first and second refractory metal layers are capable of protecting said primary conductor layer from oxidation when the electroluminescent display is annealed to activate said phosphor layer.

3. The sunlight viewable electroluminescent display panel of claim 2 wherein the edges of said assist structure and said transparent material segments are chamfered.

4. The electroluminescent display panel of claim 2, wherein said assist structure further comprises an adhesion layer formed between said first refractory metal layer and the transparent electrode, wherein said adhesion layer is capable of adhering to said transparent electrode and said first refractory metal layer.

5. The electroluminescent display panel of claim 2, wherein each of said transparent material segments comprises ITO.

6. The electroluminescent display panel of claim. 1, wherein said assist structure runs between and lengthwise alongside each of said transparent material segments.

7. The electroluminescent display panel of claim 1 wherein said assist structure runs between and lengthwise alongside each of said transparent material segments without reducing said transparent material pixel area.

8. The electroluminescent display panel of claim 7 wherein said assist structure runs lengthwise alongside one lengthwise edge of said transparent material segment.

9. The electroluminescent display panel of claim 7 wherein said assist structure runs lengthwise alongside both lengthwise edges of each of said transparent material segments.

10. The electroluminecent display panel of claim 7 wherein said assist structure runs lengthwise in a serpentine manner alternatively alongside each of the lengthwise edges of said transparent material segments.

11. An electroluminescent display panel, comprising:
    a glass substrate;
    a plurality of planar parallel segmented front electrodes deposited on said glass substrate, each of said parallel segmented front electrodes having an electrically conductive assist structure interposed within which are a plurality of equally spaced transparent material segments, said electrically conductive assist structure comprising a first refractory metal layer, a primary conductor layer formed on said first refractory layer, and a second refractory metal layer formed on said primary conductor layer such that said first and second refractory metal layers are capable of protecting said primary conductor layer from oxidation when the electroluminescent display is annealed to activate said layer of phosphor;
    a first dielectric layer deposited on said plurality of transparent electrodes;
    a layer of phosphorus material deposited on said first dielectric layer;
    a second dielectric layer deposited on said layer*of phosphorus material; and
    a plurality of metal electrodes each deposited in parallel over said second dielectric layer.

12. The sunlight viewable electroluminescent display panel of claim 11 wherein the edges of said assist structure and said transparent material segments are chamfered.

13. The electroluminescent display panel of claim 12, wherein each of said transparent material segments comprises ITO.

14. The electroluminescent display panel of claim 13 wherein said assist structure runs between and lengthwise alongside each of said transparent material segments without reducing said transparent material pixel area.

15. The electroluminescent display panel of claim 13, wherein said assist structure runs between and lengthwise alongside each of said transparent material segments.

16. The electroluminescent display panel of claim 15 wherein said transparent material segments and said assist structure forms a planar surface.

17. The electroluminescent display panel of claim 16 wherein said assist structure runs lengthwise alongside one lengthwise edge of said transparent material segment.

18. The electroluminescent display of claim 16 wherein said assist structure runs lengthwise in a serpentine manner alternatively alongside each of the lengthwise edges of said transparent material segments.

19. The electroluminescent display panel of claim 11, wherein said assist structure further comprises an adhesion layer formed between said first refractory metal layer and said plurality of parallel segmented transparent electrodes, wherein said adhesion layer is capable of adhering to said plurality of transparent electrodes and said first refractory metal layer.

* * * * *